(12) United States Patent
Kim

(10) Patent No.: US 7,465,643 B2
(45) Date of Patent: Dec. 16, 2008

(54) SEMICONDUCTOR DEVICE WITH FIXED CHANNEL IONS

(75) Inventor: Dae Young Kim, Gyeonggi-do (KR)

(73) Assignee: Hynix Semiconductor Inc., Icheon-si (KR)

(*) Notice: Subject to any disclaimer, the term of this patent is extended or adjusted under 35 U.S.C. 154(b) by 249 days.

(21) Appl. No.: 11/543,071

(22) Filed: Oct. 5, 2006

(65) Prior Publication Data

US 2007/0249132 A1 Oct. 25, 2007

(30) Foreign Application Priority Data

Apr. 25, 2006 (KR) .............. 10-2006-0037113

(51) Int. Cl.
*H01L 21/00* (2006.01)
*H01L 21/44* (2006.01)

(52) U.S. Cl. .......... 438/424; 438/427; 438/525; 438/589; 438/238; 257/E21.54; 257/E21.552; 257/E21.661; 257/E21.293; 257/321.546

(58) Field of Classification Search ............ 438/238, 438/256, 424, 427, 525, 589; 257/E21.54, 257/E21.552, E21.661, E21.293, E21.546
See application file for complete search history.

(56) References Cited

U.S. PATENT DOCUMENTS

| | | | | |
|---|---|---|---|---|
| 5,602,049 A | * | 2/1997 | Wen et al. | 438/238 |
| 5,937,297 A | | 8/1999 | Peidous | 438/270 |
| 6,162,700 A | * | 12/2000 | Hwang et al. | 438/424 |
| 6,180,458 B1 | * | 1/2001 | Krautschneider et al. | 438/259 |
| 6,312,993 B1 | | 11/2001 | Hshieh | 438/270 |
| 6,667,227 B1 | * | 12/2003 | Liu et al. | 438/589 |
| 6,683,331 B2 | | 1/2004 | Francis et al. | 257/163 |
| 2001/0023960 A1 | | 9/2001 | Soga | 257/330 |
| 2002/0006709 A1 | * | 1/2002 | Azuma | 438/427 |
| 2004/0097059 A1 | * | 5/2004 | Kwak | 438/525 |
| 2004/0180501 A1 | * | 9/2004 | Liu | 438/275 |
| 2004/0256677 A1 | * | 12/2004 | Kanda et al. | 257/369 |
| 2005/0020086 A1 | | 1/2005 | Kim | 438/700 |
| 2006/0049455 A1 | * | 3/2006 | Jang et al. | 257/330 |

FOREIGN PATENT DOCUMENTS

| | | |
|---|---|---|
| DE | 10234996 | 10/2003 |
| KR | 100180785 B1 | 3/1998 |
| KR | 1020050045799 A | 5/2005 |
| KR | 2006-0023308 A | 3/2006 |

OTHER PUBLICATIONS

Korean Notice of Rejection (translation) for KR application No. 10-2006-0037113 sent Mar. 26, 2007.
Search Report in German.

* cited by examiner

*Primary Examiner*—Michael S Lebentritt
(74) *Attorney, Agent, or Firm*—Townsend and Townsend and Crew LLP

(57) ABSTRACT

A method for manufacturing a semiconductor device includes subjecting a semiconductor substrate to thermal treatment at a temperature ranging from 770 to 830° C. to fix channel ions then forming a HTO film. The method thereby prevents a threshold voltage of a gate from changing due to diffusion of channel ions.

16 Claims, 8 Drawing Sheets

SEMICONDUCTOR DEVICE WITH FIXED CHANNEL IONS

BACKGROUND OF THE INVENTION

The present invention generally relates to a method for manufacturing a semiconductor device, and more specifically, to a method of subjecting a semiconductor substrate to thermal treatment at a temperature ranging from 770 to 830° C. to fix channel ions then forming a HTO(High Temperature Oxide) film. The method thereby prevents a threshold voltage of a gate from changing due to diffusion of channel ions.

Due to high-integration of semiconductor devices, a recess gate is formed to regulate a threshold voltage of the gate. A local gate portion of a semiconductor substrate has an active region where a channel-ion-implanting portion is partially etched to form a recess portion. In order to form a hard mask pattern for forming a recess portion, an oxide film and an anti-reflection film are used. The oxide film includes a PE-TEOS film or a TEOS film that has a relatively rapid deposition speed. The PE-TEO film or the TEOS film is formed at a temperature of 700° C. The temperature ranging from 680 to 700° C. is the optimum temperature for diffusing impurities distributed in the channel-ion-implanting portion. This phenomenon is called TED (Thermal Enhancement Diffusion) which causes a threshold voltage of the gate to change in a gate-forming-process. The threshold voltage is reduced in case of NMOS. The threshold voltage is increased in case of PMOS. This change of the threshold voltage degrades electrical characteristics of high-integrated semiconductor devices.

SUMMARY OF THE INVENTION

Various embodiments are directed at providing a method for manufacturing a semiconductor device with the optimum temperature and oxide film materials to prevent change of a threshold voltage of a gate due to TED.

According to an embodiment of the present invention, a method for manufacturing a semiconductor device comprises:

performing an channel-ion-implanting process on a semiconductor substrate having a device isolation film;

subjecting the semiconductor substrate to thermal treatment at a temperature ranging from 770 to 830° C. to fix the channel ions;

reducing the temperature of the semiconductor substrate to form a HTO (Hot Temperature Oxide) film and an anti-reflection film over the semiconductor substrate;

partially etching the HTO film and the anti-reflection film to expose a predetermined portion of the semiconductor substrate; and etching the exposed semiconductor substrate to form a recess region and removing the HTO film and the anti-reflection film to form a gate over the recess portion.

According to an embodiment of the present invention, a method for manufacturing a semiconductor device comprises:

performing an channel-ion-implanting process on a semiconductor substrate having a device isolation film;

performing a high-temperature-deposition process at a temperature ranging from 770 to 830° C. to form a HTO film over the semiconductor substrate;

forming an anti-reflection film over the HTO film;

partially etching the HTO film and the anti-reflection film to expose a predetermined portion of the semiconductor substrate; and etching the exposed semiconductor substrate to form a recess portion and removing the HTO film and the anti-reflection film to form a gate over the recess portion.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

Figure 1A:
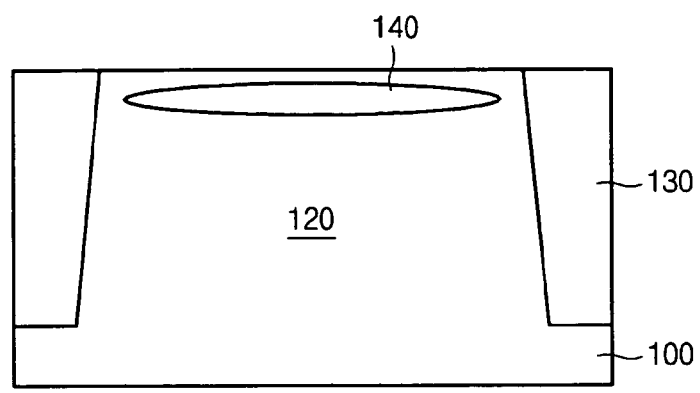
FIGS. 1a through 1e are cross-sectional diagrams illustrating a method for manufacturing a semiconductor device according to an embodiment of the present invention.
Figure 1B:
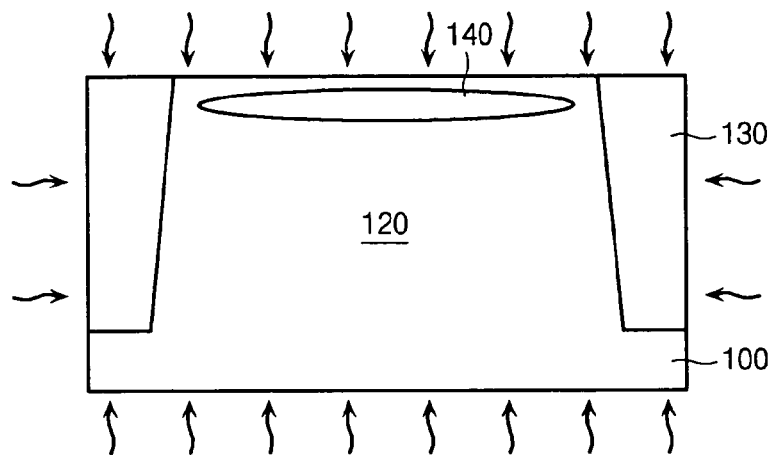
Figure 1C:
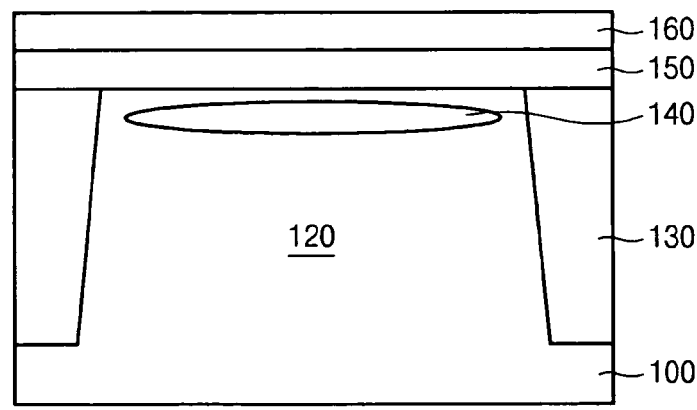
Figure 1D:
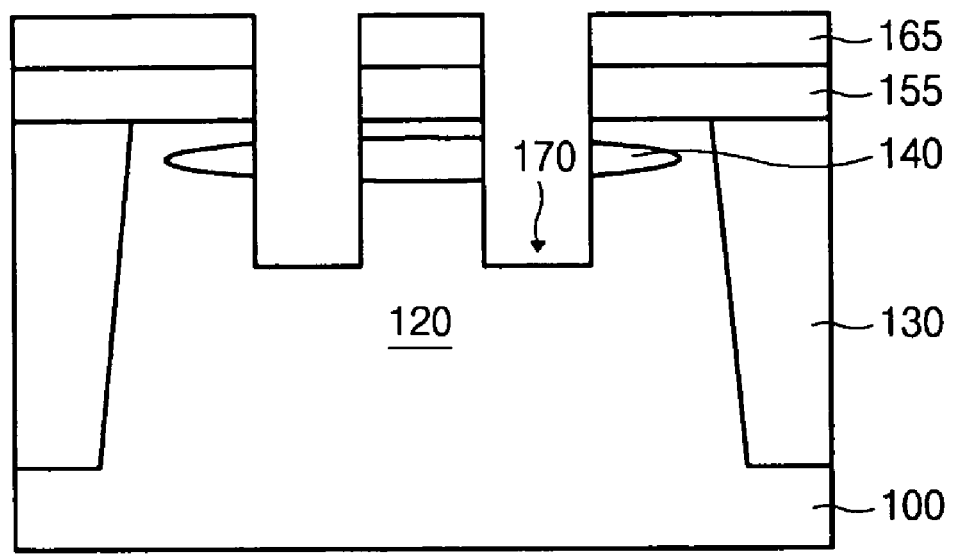
Figure 1E:
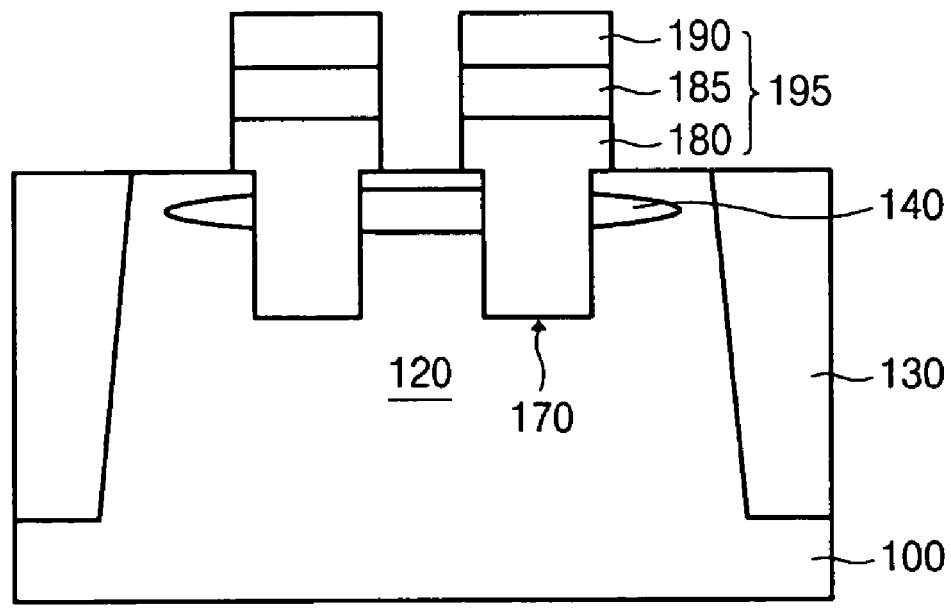

The present invention will be described in detail with reference to the accompanying drawings.

FIGS. 1a through 1e are cross-sectional diagrams illustrating a method for manufacturing a semiconductor device according to an embodiment of the present invention.

A device isolation film 130 that defines an active region 120 is formed over a semiconductor substrate 100. The device isolation film 130 includes a HDP (High Density Plasma) oxide film formed by a STI (Shallow Trench Isolation) process.

A channel-ion-implanting process is performed on the active region 120 of the semiconductor substrate 100 to form a channel-ion-implanting portion 140 over the active region 120.

The semiconductor substrate 100 is subjected to thermal treatment at a temperature ranging from 770° C. to 830° C. to fix channel ions in the channel-ion-implanting portion 140. The thermal treatment process is performed at a temperature ranging from 800° C. to 810° C. for 20~45 minutes.

After the temperature of the semiconductor substrate 100 is reduced, a HTO (Hot Temperature Oxide) film 150 and an anti-reflection film 160 are sequentially formed over the semiconductor substrate. The HTO film 150 that is an oxide film formed at a temperature of over 750° C. reduces the change of a threshold voltage.

The HTO film 150 and the anti-reflection film 160 are partially etched to form a HTO pattern 155 and an anti-reflection pattern 165 that expose a recess portion of the semiconductor substrate.

The exposed semiconductor substrate 100 is etched to form a recess portion 170.

The HTO pattern 155 and the anti-reflection pattern 165 are removed to form a gate 195 over the recess portion 170. The gate 195 has a deposition structure including a polysilicon layer 180 for filling the recess portion 170, a metal layer 185 formed over the polysilicon layer 180, and a hard mask layer 190.

Figure 2A:
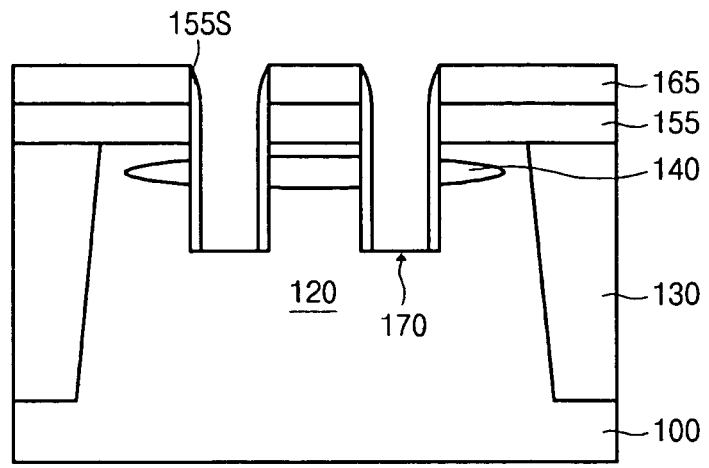
FIGS. 2a through 2c are cross-sectional diagrams illustrating a method for forming a bulb-type recess region according to an embodiment of the present invention.
Figure 2B:
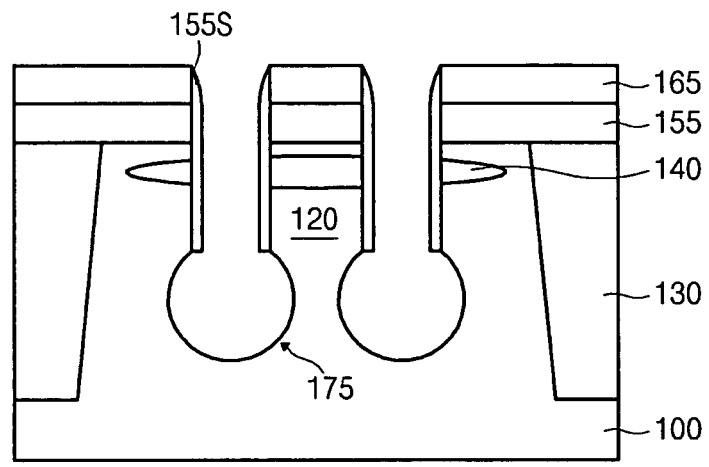
Figure 2C:
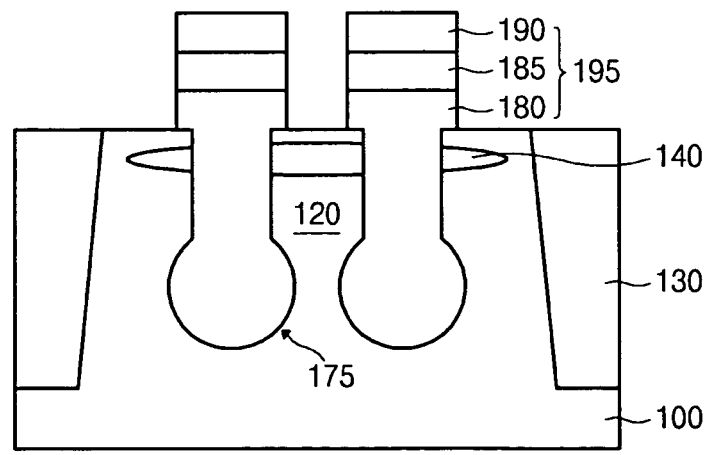

FIGS. 2a through 2c are cross-sectional diagrams illustrating a method for forming a bulb-type recess region according to an embodiment of the present invention.

After the recess portion 170 is formed (see FIG. 1d), a spacer 155S is formed at a sidewall of the recess portion 170. The spacer that includes a HTO film is subjected to thermal treatment at a temperature ranging from 770° C. to 830° C. for 5~15 minutes.

The bottom portion of the recess portion 170 is isotropic-etched with the HTO pattern 155, the anti-reflection pattern 165 and the spacer 155S as a mask so that the recess portion 170 may be a bulb-type recess portion 175.

The HTO pattern 155 and the anti-reflection pattern 165 are removed, and a gate 195 is formed over the bulb-type recess portion 175.

FIGS. 3a through 3f are cross-sectional diagrams illustrating a method for manufacturing a semiconductor device according to an embodiment of the present invention.

A device isolation film 230 that defines an active region 220 is formed over a semiconductor substrate 200. The device isolation film 230 includes a HDP (High Density Plasma) oxide film formed by a STI (Shallow Trench Isolation) process.

A channel-ion-implanting process is performed on the active region 220 of the semiconductor substrate 200 to form a channel-ion-implanting portion 240 over the active region 220.

A high-temperature-deposition process is performed on the semiconductor substrate 200 at a temperature ranging from 770° C. to 830° C. to form a HTO film 250. Then, the anti-reflection film 260 is formed over the HTO film 250 in a high temperature deposition process performed at a temperature ranging from 800° C. to 810° C.

Figure 3A:
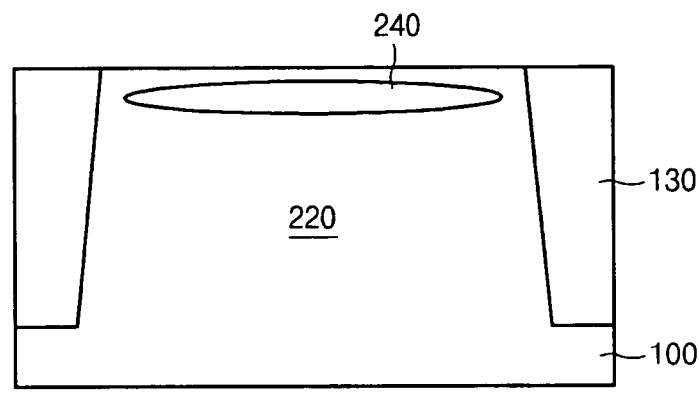
FIGS. 3a through 3f are cross-sectional diagrams illustrating a method for manufacturing a semiconductor device according to an embodiment of the present invention.
Figure 3B:
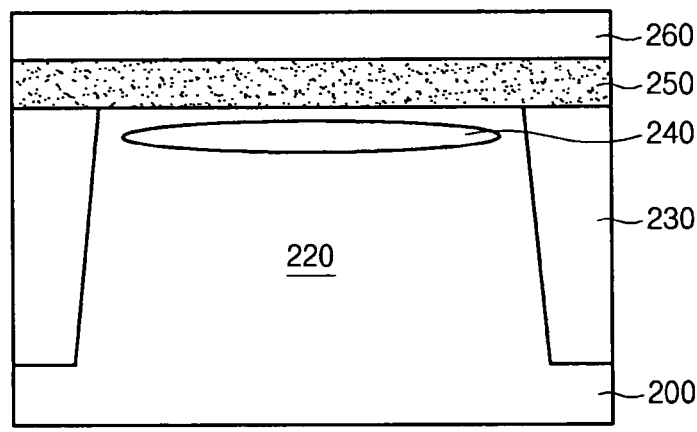
Figure 3C:
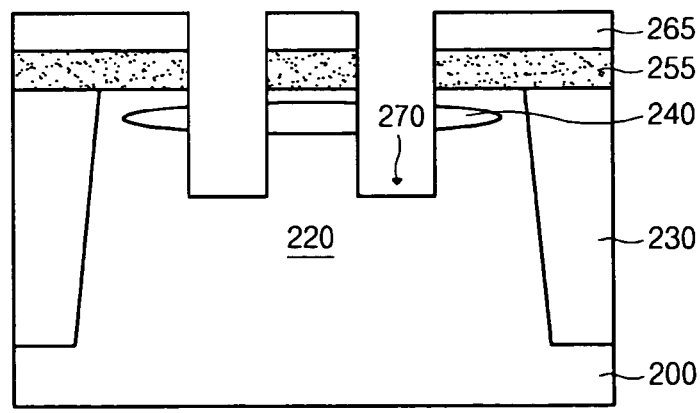
Figure 3D:
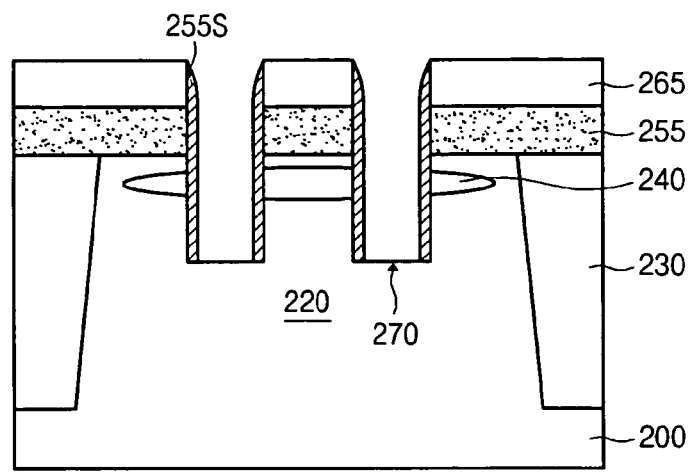
Figure 3E:
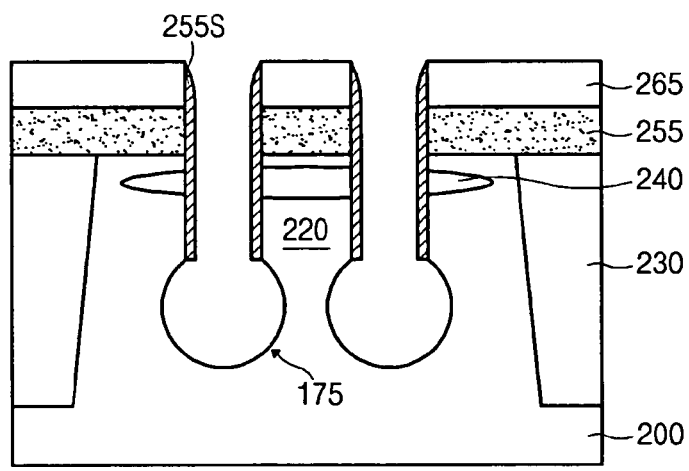
Figure 3F:
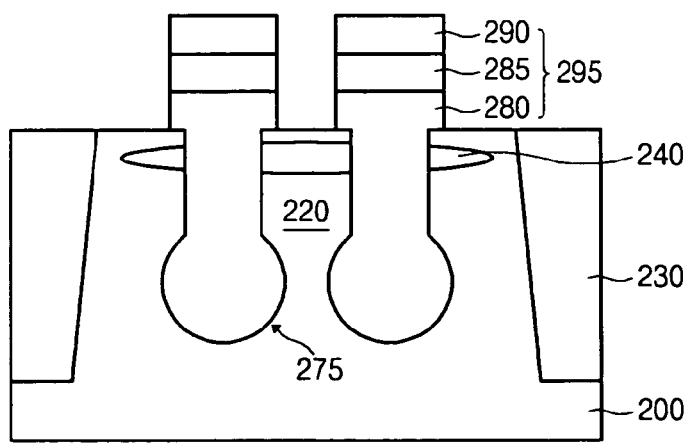

The HTO (Hot Temperature Oxide) film 250 and an anti-reflection film 260 are partially etched to form a HTO pattern 255 and an anti-reflection pattern 265 that expose a recess portion of the semiconductor substrate. The exposed semiconductor substrate 200 is etched to form a recess portion 270. As shown in FIG. 3f, a gate may be formed over the recess portion 270 to obtain a semiconductor device.

Then, a spacer 255S is formed at a sidewall of the recess portion 270. The spacer 255S that includes a HTO film is subjected to thermal treatment at a temperature ranging from 770 to 830° C. for 5~15 minutes.

The bottom portion of the recess portion 270 is isotropic-etched with the HTO pattern 255, the anti-reflection pattern 265 and the spacer 255S as a mask so that the recess portion 170 may be a bulb-type recess portion 275.

The HTO pattern 255 and the anti-reflection pattern 265 are removed, and a gate 295 is formed over the bulb-type recess portion 275.

The HTO pattern 255 and the anti-reflection pattern 265 are removed to form a gate 295 over the recess portion 275. The gate 295 has a deposition structure including a polysilicon layer 280 for filling the recess portion 275, a metal layer 285 formed over the polysilicon layer 280, and a hard mask layer 290.

Figure 4:
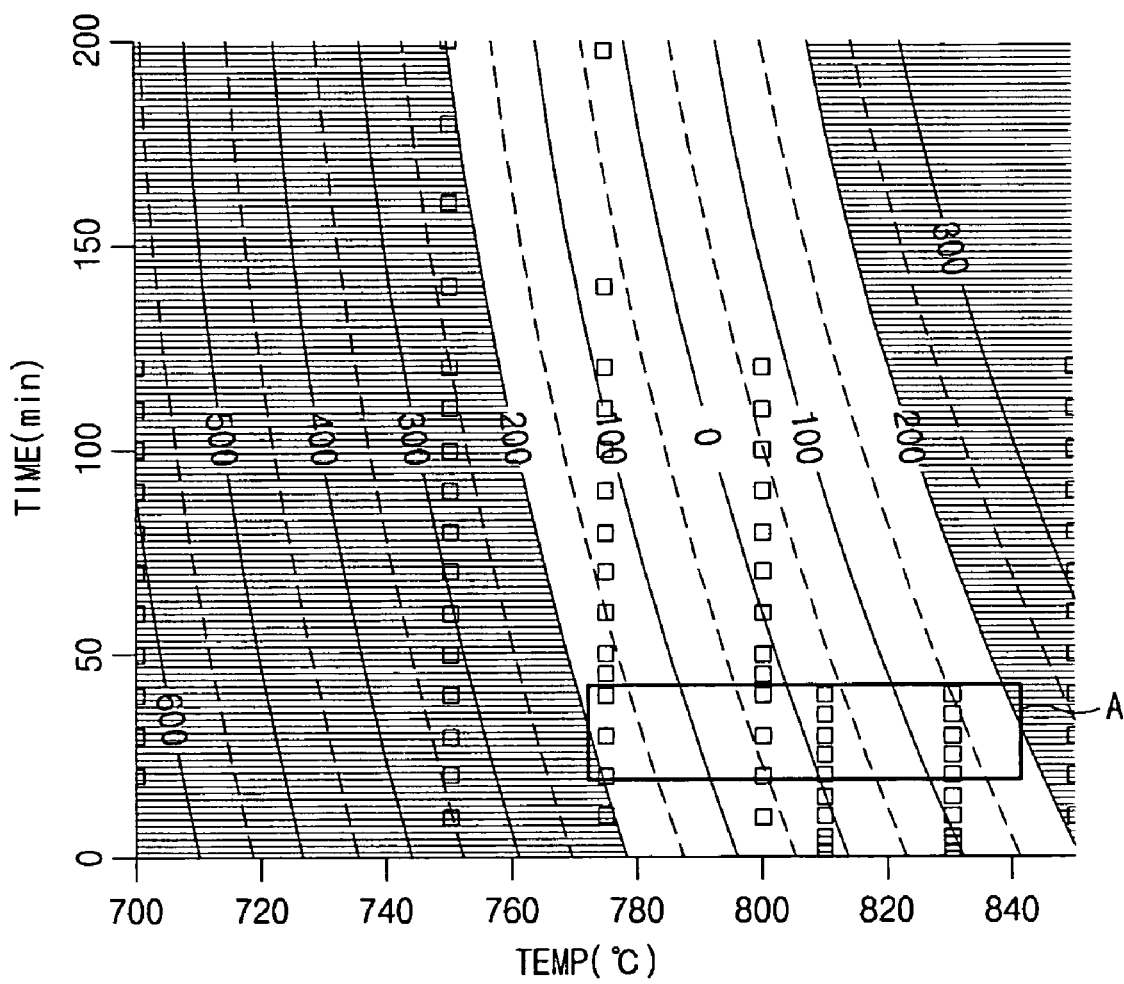
FIG. 4 is a graph illustrating temperature and time change depending on the change amount of a threshold voltage.

FIG. 4 is a graph illustrating temperature and time change depending on the change amount of a threshold voltage.

The temperature is shown to change ranging from 775° C. to 840° C. while the threshold voltage changes ranging from –200 to 200 mV (see region A). When the proper time depending on the temperature for forming an oxide film having a predetermined thickness is displayed with a rectangular type on the graph, the density is shown to be relatively dense (see region A) at a temperature ranging from 810° C. to 830° C. for 20~45 minutes. As a result, the process for subjecting the semiconductor substrate to thermal treatment or forming the oxide film can be performed stably for 20~45 minutes.

Figure 5:
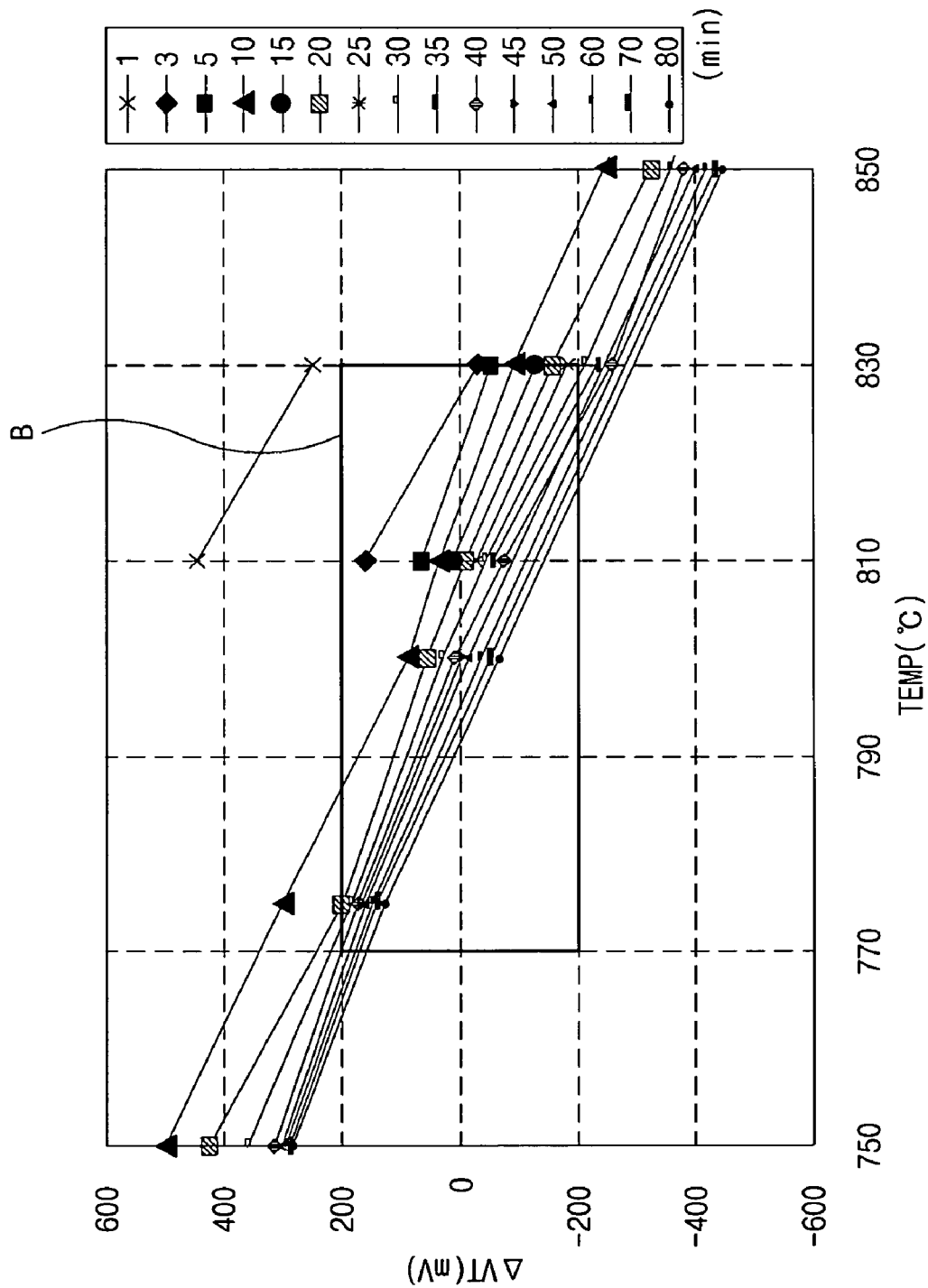
FIG. 5 is a graph illustrating change of the threshold voltage depending on temperature.

FIG. 5 is a graph illustrating change of the threshold voltage depending on temperature.

The range of the temperature ranges from 770° C. to 830° C. while the change amount (ΔVt) of the threshold voltage ranges from –200 to 200 mV (see region B). When regions are represented by different lines depending on process time, the timing when the change amount of the threshold voltage reaches 0° C. at 810° C. ranges from 20 to 45 minutes.

Figure 6:
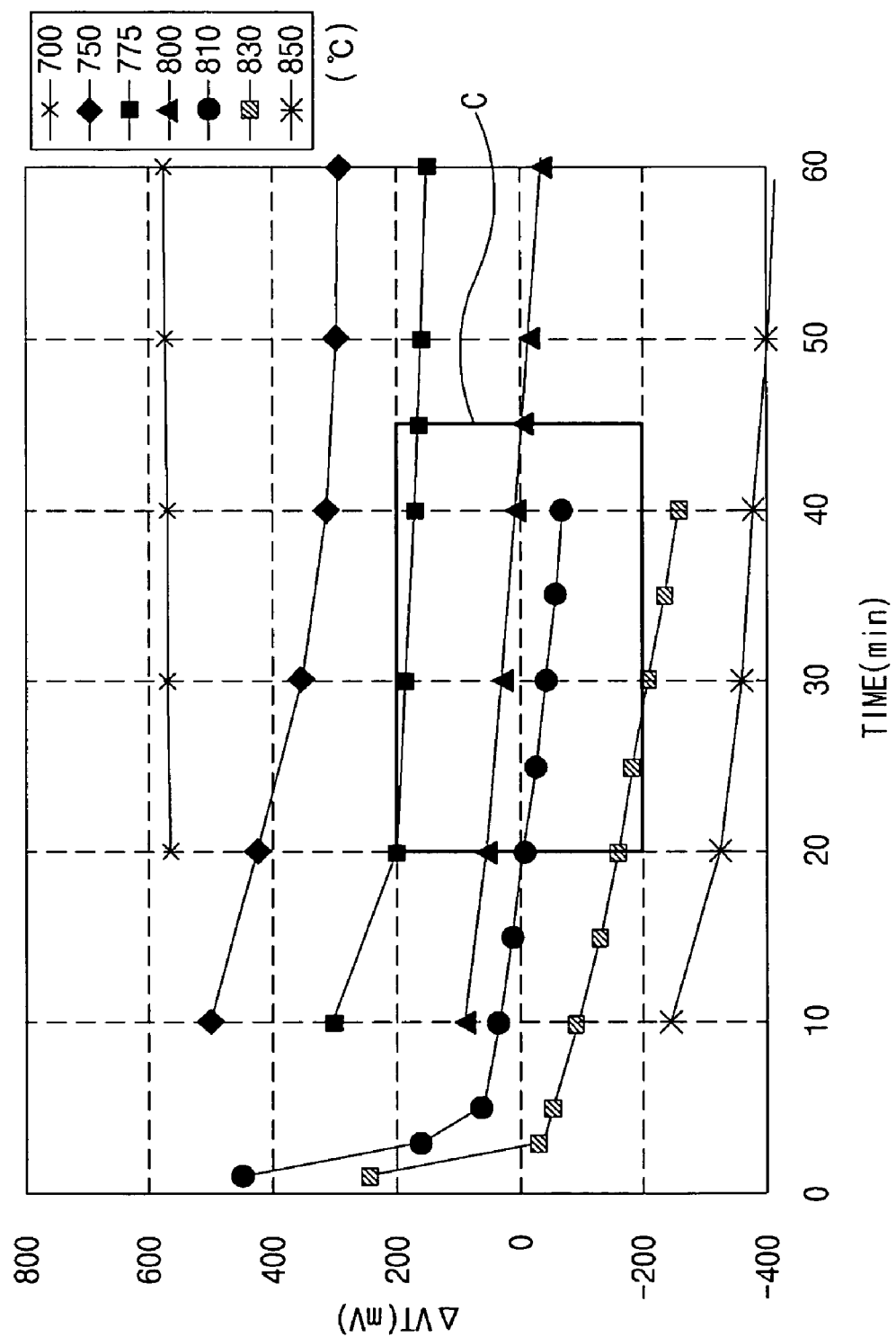
FIG. 6 is a graph illustrating change of the threshold voltage depending on time.

FIG. 6 is a graph illustrating change of the threshold voltage depending on time.

The range of the time ranges from 25 to 45 minutes while the change amount (ΔVt) of the threshold voltage ranges from –200 to 200 mV (see region C). The range of the temperature included in the region C is shown to range from 775° C. to 830° C.

As described above, a method for manufacturing a semiconductor device according to an embodiment of the present invention includes subjecting a semiconductor substrate to thermal treatment at a temperature ranging from 770 to 830° C. to fix channel ions or forming a HTO film, thereby preventing a threshold voltage of a gate from changing due to diffusion of channel ions to improve electrical characteristics and reliability of semiconductor devices.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising:
   performing an channel-ion-implanting process on a semiconductor substrate having a device isolation film;
   subjecting the semiconductor substrate to thermal treatment at a temperature ranging from about 770° C. to about 830° C. to fix the channel ions;
   reducing the temperature of the semiconductor substrate to form a HTO (Hot Temperature Oxide) film and an anti-reflection film over the semiconductor substrate;
   partially etching the HTO film and the anti-reflection film to expose a predetermined portion of the semiconductor substrate; and
   etching the exposed semiconductor substrate to form a recess region and removing the HTO film and the anti-reflection film to form a gate over the recess portion.

2. The method according to claim 1, wherein the device isolation film includes a HDP (High Density Plasma) oxide film formed by a STI (Shallow Trench Isolation) process.

3. The method according to claim 1, wherein the thermal treatment of the semiconductor substrate is performed for 20~45 minutes.

4. The method according to claim 1, wherein the temperature of the thermal treatment ranges from 800 to 810° C.

5. The method according to claim 1, wherein the gate has a deposition structure including a polysilicon layer for filling the recess portion, a metal layer formed over the polysilicon layer, and a hard mask layer.

6. The method according to claim 1, further comprising:
- forming the recess portion to form a spacer at a sidewall of the recess portion;
- isotropic-etching the bottom portion of the recess portion to form a bulb-type recess portion; and
- removing the HTO film and the anti-reflection film to form a gate over the recess portion.

7. The method according to claim 6, wherein the spacer includes a HTO film.

8. The method according to claim 6, wherein the spacer is subjected to thermal treatment at a temperature ranging from 770 to 830° C. for 5-15 minutes.

9. A method for manufacturing a semiconductor device, the method comprising:
- performing an channel-ion-implanting process on a semiconductor substrate having a device isolation film;
- performing a high-temperature-deposition process at a temperature ranging from 770 to 830° C. to form a HTO film over the semiconductor substrate;
- forming an anti-reflection film over the HTO film;
- partially etching the HTO film and the anti-reflection film to expose a predetermined portion of the semiconductor substrate; and
- etching the exposed semiconductor substrate to form a recess portion and removing the HTO film and the anti-reflection film to form a gate over the recess portion.

10. The method according to claim 9, wherein the device isolation film includes a HDP (High Density Plasma) oxide film by a STI (Shallow Trench Isolation) process.

11. The method according to claim 9, wherein the forming-HTO-film step is performed for 20~45 minutes.

12. The method according to claim 9, wherein the high-temperature-deposition temperature ranges from 770 to 830° C.

13. The method according to claim 9, further comprising:
- forming the recess portion to form a spacer at a sidewall of the recess portion;
- isotropic-etching the bottom portion of the recess portion to form a bulb-type recess portion; and
- removing the HTO film and the anti-reflection film to form a gate over the recess portion.

14. The method according to claim 13, wherein the spacer includes a HTO film.

15. The method according to claim 13, wherein the spacer is subjected to thermal treatment at a temperature ranging from 770 to 830° C. for 5~15 minutes.

16. The method according to claim 9, wherein the gate has a deposition structure including a polysilicon layer for filling the recess portion, a metal layer formed over the polysilicon layer, and a hard mask layer.

* * * * *